United States Patent
Nakahara

(10) Patent No.: US 7,196,348 B2
(45) Date of Patent: Mar. 27, 2007

(54) GAN SYSTEM SEMICONDUCTOR LIGHT EMITTING DEVICE EXCELLENT IN LIGHT EMISSION EFFICIENCY AND LIGHT EXTRACTING EFFICIENCY

(75) Inventor: Ken Nakahara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 65 days.

(21) Appl. No.: 10/763,137

(22) Filed: Jan. 21, 2004

(65) Prior Publication Data

US 2004/0164314 A1    Aug. 26, 2004

(30) Foreign Application Priority Data

Feb. 12, 2003  (JP)  ............. 2003-034366
Dec. 25, 2003  (JP)  ............. 2003-430220

(51) Int. Cl.
  *H01L 29/06*  (2006.01)
  *H01L 31/0328*  (2006.01)
  *H01L 31/0336*  (2006.01)
  *H01L 31/072*  (2006.01)
  *H01L 31/109*  (2006.01)

(52) U.S. Cl. ............ 257/13; 257/94; 257/96; 257/97; 257/101; 257/102; 257/103

(58) Field of Classification Search ............ 257/13, 257/94, 96–97, 101–103
See application file for complete search history.

(56) References Cited

U.S. PATENT DOCUMENTS 5,625,202 A * 4/1997 Chai ............... 257/94
5,804,834 A * 9/1998 Shimoyama et al. ...... 257/22
5,889,295 A * 3/1999 Rennie et al. ...... 257/96
6,057,561 A * 5/2000 Kawasaki et al. ...... 257/94

(Continued)

FOREIGN PATENT DOCUMENTS

JP    11-070610    3/1999

(Continued)

OTHER PUBLICATIONS

Mathew, J., et al., "p-Type Electrical Conduction in ZnO Thin Films by Ga and N Codoping", Jpn. J. Appl. Phys., 1999 vol. 38, No. 11A, pp. L1205-L1207 (not enclosed).

*Primary Examiner*—Ida M. Soward
(74) *Attorney, Agent, or Firm*—Hogan & Hartson LLP.

(57) ABSTRACT

Although there is provided a high light transmittance of an emitted light by a ITO electrode film conventionally employed, there occurs a formation of a Schottky type contact between the ITO electrode film and a p type GaN system semiconductor layer, thus resulting in a not uniform flow of an electric current. It is an object of the present invention to provide a semiconductor light emitting device constituted by forming a transparent electrode, which facilitates acquiring an ohmic property, to be replaced by an ITO electrode film, at the light extracting or light exit side of the GaN system semiconductor light emitting device, so as to improve a light emission efficiency and a radiation extracting efficiency or a light exit efficiency of a GaN system semiconductor light emitting device. In order to accomplish the above mentioned object, the present invention provides a semiconductor light emitting device comprising a light emission layer, consisting of a GaN system semiconductor, which is interposed between an n type GaN system semiconductor layer and a p type GaN system semiconductor layer, wherein there is provided a Ga-doped $Mg_zZn_{1-z}O$ ($0 \leq z < 1$) electrode film.

12 Claims, 6 Drawing Sheets

U.S. PATENT DOCUMENTS

| | | | |
|---|---|---|---|
| 6,320,207 B1 * | 11/2001 | Furukawa et al. | 257/101 |
| 6,416,888 B1 * | 7/2002 | Kawamura et al. | 428/690 |
| 6,541,797 B1 * | 4/2003 | Udagawa | 257/94 |
| 6,674,098 B1 | 1/2004 | Niki et al. | 257/102 |
| 6,693,302 B2 * | 2/2004 | Hori et al. | 257/79 |
| 6,806,503 B2 * | 10/2004 | Hosono et al. | 257/79 |
| 6,982,438 B2 * | 1/2006 | Ishizaki | 257/103 |
| 2002/0030196 A1 * | 3/2002 | Iwata et al. | 257/102 |
| 2002/0105279 A1 | 8/2002 | Kimura | 315/169.3 |
| 2002/0126719 A1 * | 9/2002 | Kadota | 372/45 |
| 2003/0209723 A1 * | 11/2003 | Sakai | 257/102 |
| 2004/0051109 A1 * | 3/2004 | Ishizaki et al. | 257/89 |
| 2004/0104392 A1 * | 6/2004 | Ishizaki | 257/79 |
| 2004/0235212 A1 * | 11/2004 | Ishizaki | 438/46 |

FOREIGN PATENT DOCUMENTS

| | | |
|---|---|---|
| JP | 2000-353820 | 12/2000 |
| JP | 2001-210867 | 8/2001 |
| JP | 2002-076356 | 3/2002 |
| JP | 2002-111059 | 4/2002 |
| JP | 2002-164570 | 6/2002 |
| JP | 2002-170993 | 6/2002 |
| JP | 2002-222991 | 8/2002 |
| WO | 01/08229 | 2/2001 |

* cited by examiner

GAN SYSTEM SEMICONDUCTOR LIGHT EMITTING DEVICE EXCELLENT IN LIGHT EMISSION EFFICIENCY AND LIGHT EXTRACTING EFFICIENCY

BACKGROUND OF THE INVENTION

1. Field of the Invention

The present application relates to a GaN system semiconductor light emitting device comprising a light emission layer, consisting of a GaN system semiconductor, and more specifically to a GaN system semiconductor light emitting device excellent in light emission efficiency and light extracting efficiency.

2. Description of the Related Art

Since a GaN system semiconductor light emitting device comprising GaN system semiconductor layers makes it possible to realize a white light LED, there is taken into account a possibility of serviceability as an electronic device for lighting applicable to a back light. The GaN system semiconductor light emitting device has as its basic structure a pn junction diode, wherein a light emission layer is interposed between an n type GaN system semiconductor layer and a p type GaN system semiconductor layer. Toward the light emission layer electrons are injected from the n type GaN system semiconductor layer whereas holes are injected from the p type GaN system semiconductor layer, whereupon they are recombined in the light emission layer to emit a light. However, especially based upon a high resistivity (several Ω·cm) of the p type GaN system semiconductor layer, only attaching directly a metal electrode for a bonding pad for supplying an electric current, to the n type GaN system semiconductor layer or the p type GaN system semiconductor layer, would inconveniently lead to a limited flow of an electric current solely around the metal electrode. As a result, in a light emission layer, which is spaced apart from the metal electrode periphery, an emission weakens. On the other hand, any light emitted around the metal electrode is prevented by the metal electrode from being extracted out of the semiconductor light emitting device.

Conventionally, in order to attain a uniform distribution of the electric current, it has been conceived to form a metal thin film for the electric current diffusion. As such the metal thin film material like a Ni/Au laminating electrode, Pt, and etc, should be annealed in an oxygen atmosphere to make it more transparent. However, although resistivity of Ni/Au or Pt is small, its transparency is not sufficient, resulting in degrading of any efficiency of taking out the emitted light or any light extracting efficiency or light exit efficiency of same. Thinning the metal film in order to increase a light transmittance, would result in the liability of easier break down of a film portion, whose film thickness is smaller than that of other film portions due to the electric current, whereupon furthermore any increase of the resistance in the lateral direction would lead to the failure to accomplish a primary object to achieve a uniform distribution of the electric current.

Moreover, there has also been proposed a method of forming an ITO (Indium Tin Oxide) electrode film for the electric current diffusion. In FIG. 6 an example embodiment has been shown, according to which there is formed the ITO electrode film for a GaN system semiconductor light emitting device. In FIG. 6, 51 designates a metal electrode, 52 designates an ITO electrode film, 53 designates a p type GaN system semiconductor layer, 54 designates a light emission layer, 55 designates an n type GaN system semiconductor layer, 56 designates a metal electrode, 57 designates a sapphire substrate. In FIG. 6, a light emission takes place in the light emission layer 54 interposed between the n type GaN system semiconductor layer 55 on the sapphire substrate 57 and the p type GaN system semiconductor layer 53. The electric current supply to the n type GaN system semiconductor layer 55 is carried out via the metal electrode 56. The electric current supply to the p type GaN system semiconductor layer 53 is carried out via the metal electrode 51 and the ITO electrode film 52.

However, although there is provided a high light transmittance of emitted light by the ITO electrode film, there occurs a formation of a Schottky type contact between the ITO electrode film and the p type GaN system semiconductor layer, thus resulting in not uniform flow of any electric current. Generally, in case of making a contact between an ITO electrode film and a n type GaN system semiconductor layer or a p type GaN system semiconductor layer, an ohmic contact is difficult to provide, while a Schottky type contact would be forced to be formed. When the Schottky type contact being formed, a potential barrier is produced between the semiconductor layer and the ITO electrode film, whereby, the driving voltage increases, thereby resulting in an increase of power dissipation and an increase of heat generation.

Moreover, there have also been made attempts to attain an ohmic property by means of a transparent electrode comprising ZnO as an electrode. This utilizes the recognition, or the fact that an ohmic contact can be obtained by providing a contact between ZnO and an n type GaN system semiconductor layer or a p type GaN system semiconductor layer.

In the present application, materials are represented by means of the symbol of elements, for example, Ga represents gallium and B represents boron.

SUMMARY OF THE INVENTION

In order to solve the above-mentioned problems pertaining to the conventional technologies, it is an object of the present invention to provide a semiconductor light emitting device constituted by forming a transparent electrode, which facilitates acquiring an ohmic property, instead of an ITO electrode film, at the light extracting or light exit side of the GaN system semiconductor light emitting device, so as to improve a light emission efficiency and a light extracting efficiency of a GaN system semiconductor light emitting device.

In order to accomplish the object mentioned above, a first invention of the present application provides a semiconductor light emitting device comprising a light emission layer, consisting of a GaN system semiconductor, interposed between an n type GaN system semiconductor layer and a p type GaN system semiconductor layer, wherein the semiconductor light emitting device has a Ga-doped $Mg_zZn_{1-z}O$ ($0 \leq z < 1$) electrode film. The first invention of the present application enables a diffusion of an electric current in the facial direction of the $Mg_zZn_{1-z}O$ electrode film, and also enables a reduction of the potential barrier between the $Mg_zZn_{1-z}O$ electrode film and the n type GaN system semiconductor layer or the p type GaN system semiconductor layer. In this invention, a GaN system semiconductor layer means a semiconductor layer comprising at least one layer of $In_pGa_qAl_rN$ ($p+q+r=1$, $p \geq 0$, $q \geq 0$, $r \geq 0$).

There is provided a second invention of the present application based upon a subject matter, as its preamble portion, of a semiconductor light emitting device according to the first invention of the present application, and, featured as its characterizing part, in that there is provided a metal electrode, which supplies an electric current to either the n type GaN system semiconductor layer or the p type GaN system semiconductor layer and that the Ga-doped $Mg_zZn_{1-z}O$ ($0 \leq z < 1$) electrode film is formed between the n type GaN system semiconductor layer or the p type GaN system semiconductor layer, and the metal electrode.

There is provided a third invention of the present application based upon a subject matter, as its preamble portion, of a semiconductor light emitting device according to the first invention of the present application, and, featured as its characterizing part, in that that there is provided a metal electrode, which supplies an electric current to either the n type GaN system semiconductor layer or the p type GaN system semiconductor layer and that the metal electrode and the Ga-doped $Mg_zZn_{1-z}O$ ($0 \leq z < 1$) electrode film adjoin each other; and the metal electrode and the Ga-doped $Mg_zZn_{1-z}O$ ($0 \leq z < 1$) electrode film are arranged so as to be contiguous to the face of the n type GaN system semiconductor layer or the p type GaN system semiconductor layer and the metal electrode.

The third invention of the present application enables facilitates the electric current supply to the $Mg_zZn_{1-z}O$ electrode film.

There is provided a fourth invention of the present application based upon a subject matter, as its preamble portion, of a semiconductor light emitting device according to either the first, second or third invention of the present application, and, featured as its characterizing part, in that associated with a quantity of the doped Ga, with which the $Mg_zZn_{1-z}O$ ($0 \leq z < 1$) electrode film is doped, a carrier concentration is $1 \times 10^{19}$ cm$^{-3}$ or more and less than $5 \times 10^{21}$ cm$^{-3}$. The fourth invention of the present application enables the reduction of the resitivity of the $Mg_zZn_{1-z}O$ electrode film.

There is provided according to a fifth invention of the present application a semiconductor light emitting device comprising a light emission layer, consisting of a GaN system semiconductor, which is interposed between a n type GaN system semiconductor layer and a p type GaN system semiconductor layer, wherein there is provided a B-doped $Mg_zZn_{1-z}O$ ($0 \leq z < 1$) electrode film. The fifth invention of the present application provides doping of B, which is the same IIIB group element as Ga, instead of Ga, and enables electric current to diffuse into the surface side of the $Mg_zZn_{1-z}O$ electrode film, while enabling the reduction of the potential barrier between the $Mg_zZn_{1-z}O$ electrode film and the n type GaN system semiconductor layer or the p type GaN system semiconductor layer.

There is provided a sixth invention of the present application, based upon a subject matter, as its preamble portion, of a semiconductor light emitting device according to the fifth invention of the present application, and, featured as its characterizing part, in that there is provided a metal electrode, which supplies an electric current to either the n type GaN system semiconductor layer or the p type GaN system semiconductor layer, wherein the B-doped $Mg_zZn_{1-z}O$ ($0 \leq z < 1$) electrode film is formed between the n type GaN system semiconductor layer or the p type GaN system semiconductor layer, and the metal electrode. The sixth invention of the present application enables facilitating a supply of the electric current to the $Mg_zZn_{1-z}O$ electrode film.

There is provided a seventh invention of the present application, based upon a subject matter, as its preamble portion, of a semiconductor light emitting device according to the fifth invention of the present application, and, featured as its characterizing part, in that there is provided a metal electrode, which supplies an electric current to either the n type GaN system semiconductor layer or the p type GaN system semiconductor layer, wherein the metal electrode and the B-doped $Mg_zZn_{1-z}O$ ($0 \leq z < 1$) electrode film are arranged so as to be contiguous to the face of the n type GaN system semiconductor layer or the p type GaN system semiconductor layer and the metal electrode. The seventh invention of the present application enables facilitating a supply of the electric current to the $Mg_zZn_{1-z}O$ electrode film.

There is provided a eighth invention of the present application based upon a subject matter, as its preamble portion, of a semiconductor light emitting device according to either the fifth, sixth or seventh invention of the present application, and, featured as its characterizing part, in that associated with a quantity of the doped B, with which the $Mg_zZn_{1-z}O$ ($0 \leq z < 1$) electrode film is doped, a carrier concentration is $1 \times 10^{19}$ cm$^{-3}$ or more and less than $5 \times 10^{21}$ cm$^{-3}$. The eighth invention of the present application enables the reduction of the resitivity of the $Mg_zZn_{1-z}O$ electrode film. In addition, any combination of arrangements of those inventions is possible to the permissible greatest extent.

DETAILED DESCRIPTION OF THE INVENTION

Hereinafter, embodiments of the present invention will be described with reference to accompanying drawings.

DESCRIPTION OF THE PREFERRED EMBODIMENTS

Figure 1:
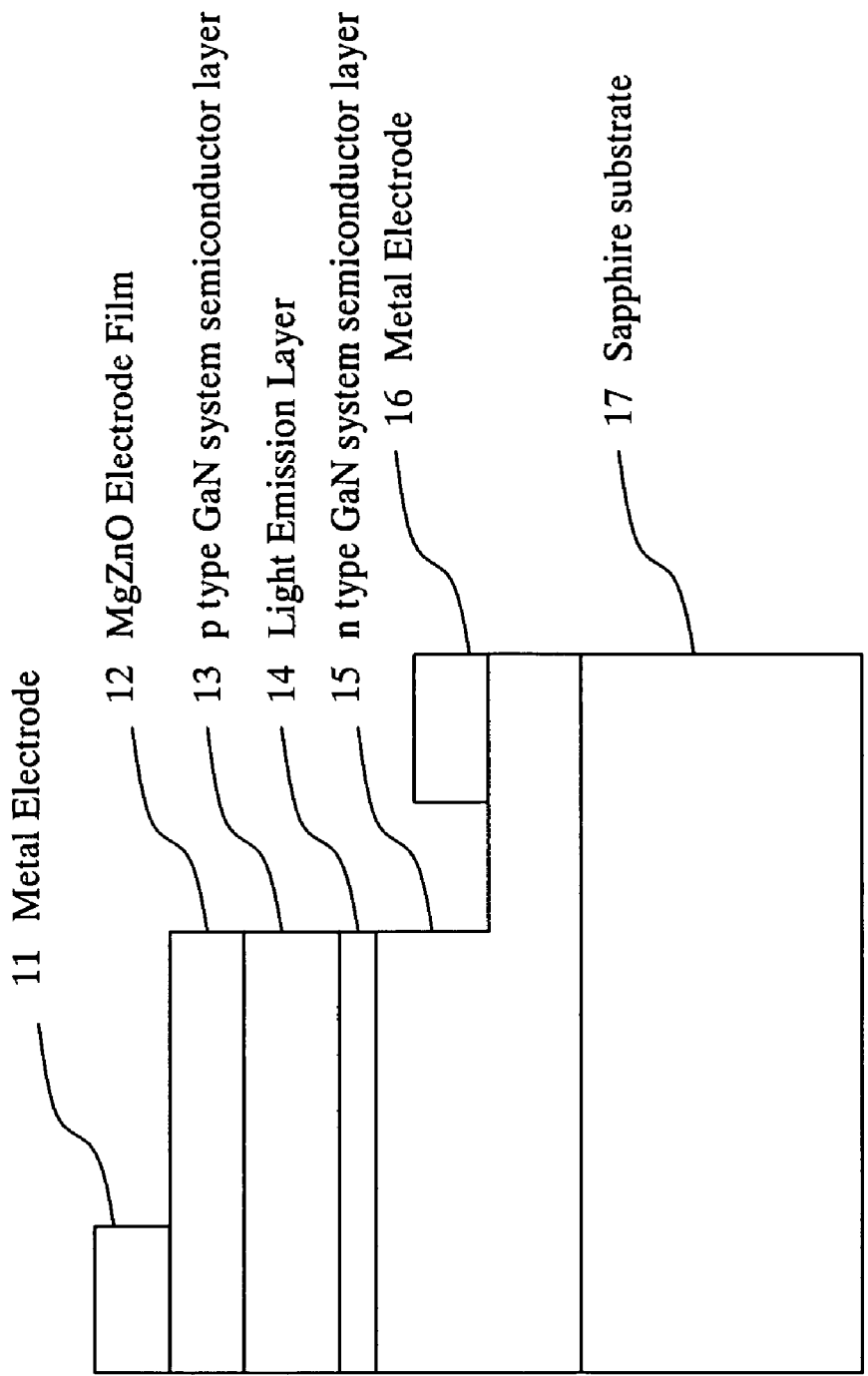
FIG. 1 is a view explaining a structure of a GaN system semiconductor light emitting device according to an embodiment of the present application.

A first embodiment of the present invention is shown in FIG. 1. In FIG. 1, 11 is a metal electrode, 12 is a MgZnO electrode film, 13 is a p type GaN system semiconductor layer, 14 is a light emission layer, 15 is an n type GaN system semiconductor layer, 16 is a metal electrode, and 17 is a sapphire substrate.

In such a GaN system semiconductor light emitting device, first of all, the n type GaN system semiconductor layer 15 is formed on the top surface of the sapphire substrate 17 with MOCVD (metal organic chemical vapor deposition) method and the like. It is suitable that the n type GaN system semiconductor layer 15 is constituted of an n type GaN and a GaN buffer layer. The n type GaN system semiconductor layer 15 may be formed with ELO (Epitaxial Lateral Overgrowth). The light emission layer 14 is formed on the top surface of the n type GaN system semiconductor layer 15. The light emission layer 14 consists of $In_xGa_{1-x}N$ ($0 \leq x < 1$) or/and $Al_yGa_{1-y}N$ ($0 \leq y < 1$). Moreover, the light emission layer 14 may be a multi-quantum well structure of $In_xGa_{1-x}N/GaN$ ($0 \leq x < 1$) with an adjusted ratio of In and Ga, or a multi-quantum well structure of $Al_yGa_{1-y}N/GaN$ ($0 \leq y < 1$) with an adjusted ratio of Al and Ga. Furthermore, a multi-quantum well structure of $In_pGa_qAl_rN/GaN$ ($p+q+r=1$, $p \geq 0$, $q \geq 0$, $r \geq 0$) may be applicable with an adjusted ratio of In, Ga and Al. Moreover, a layer comprising an n type $Al_yGa_{1-y}N$ ($0 \leq y < 1$) may be also formed on the n type GaN system semiconductor layer 15 side of the light emission layer 14, or a layer consisting of $Al_yGa_{1-y}N$ ($0 \leq y < 1$) may be as well formed on the p type GaN system semiconductor layer 13 side of the light mission layer 14.

Next, the p type GaN system semiconductor layer 13 is formed on the top surface of the light emission layer 14. After there has been formed the ZnO transparent electrode film 12, comprising Ga doped $Mg_zZn_{1-z}O$ ($0 \leq z < 1$), on the top surface of the p type GaN system semiconductor 13, a portion of the MgZnO transparent electrode film 12, the p type GaN system semiconductor layer 13, the light emission layer 14, and the n type GaN system semiconductor layer 15 are removed by etching. The n type GaN system semiconductor layer 15 is etched down to the midway of the layer thereof. Next, the metal electrode 16 is formed on the top surface of the exposed n type GaN system semiconductor layer 15, and the metal electrode 11 is formed on the top surface of the MgZnO electrode film 12 with an evaporation method or a sputtering method. Ga-doped $Mg_zZn_{1-z}O$ ($0 \leq z < 1$) may be replaced by B-doped $Mg_zZn_{1-z}O$ ($0 \leq z < 1$).

Alternatively, after there has been formed the p type GaN system semiconductor layer 13 on the top surface of the light emission layer 14, a portion of the p type GaN system semiconductor layer 13, the light emission layer 14, and the n type GaN system semiconductor layer 15 are removed by etching. The n type GaN system semiconductor layer 15 is etched down to the midway of the layer thereof. Next, there is formed the MgZnO electrode film 12, comprising Ga-doped $Mg_zZn_{1-z}O$ ($0 \leq z < 1$) on the top surface of the p type GaN system semiconductor layer 13. The metal electrode 16 is formed on the top surface of the exposed n type GaN system semiconductor layer 15, while the metal electrode 11 is formed on the top surface of the MgZnO electrode film 12 with an evaporation method or a sputtering method. B-doped $Mg_zZn_{1-z}O$ ($0 \leq z < 1$) in place of Ga-doped $Mg_zZn_{1-z}O$ ($0 \leq z < 1$) may be applicable.

The above-mentioned MgZnO film 12 is formed with a sputtering method by using a target in the form with a baked mixture of $Ga_2O_3$, an ion plating method and the like, MgO and ZnO powders. Moreover, the MgZnO film may as well be formed with an evaporation method similar to a molecular beam epitaxial method, which provides for a metal Ga, a metal Mg and a metal Zn, after being heated by a heater as a molecular beam, and provides for oxygen by means of RF radical cell.

Figure 2:
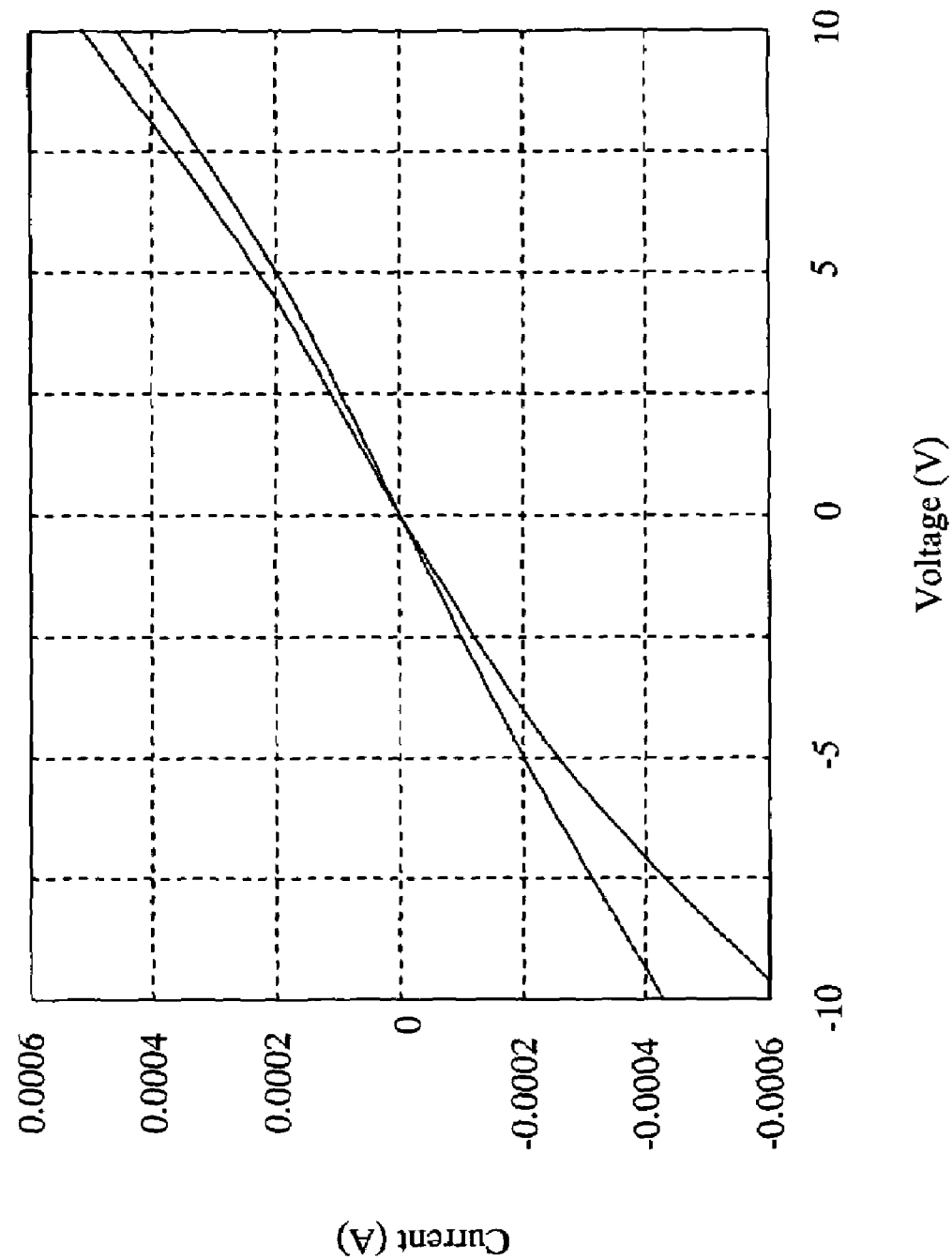
FIG. 2 is a view explaining an experimental result about the characteristics of electric current versus voltage, in junction between a ZnO film and a p type GaN layer.

ZnO as a material of the transparent-electrode film forms an ohmic contact in a junction to the p type GaN system semiconductor. FIG. 2 is a characteristic of electric current versus voltage, which shows junction state of the ZnO film and the p type GaN layer, wherein a horizontal axis shows applied voltage and a vertical axis shows the electric current. According to FIG. 2, since the electric current is almost proportional to the applied voltage, it shows that an ohmic contact is obtained without annealing after having formed the ZnO film by a molecular beam epitaxial method. MgZnO can be used as a material of the transparent-electrode film, and furthermore an ohmic contact in a junction to a p type GaN system semiconductor can be obtained like ZnO.

Figure 3:
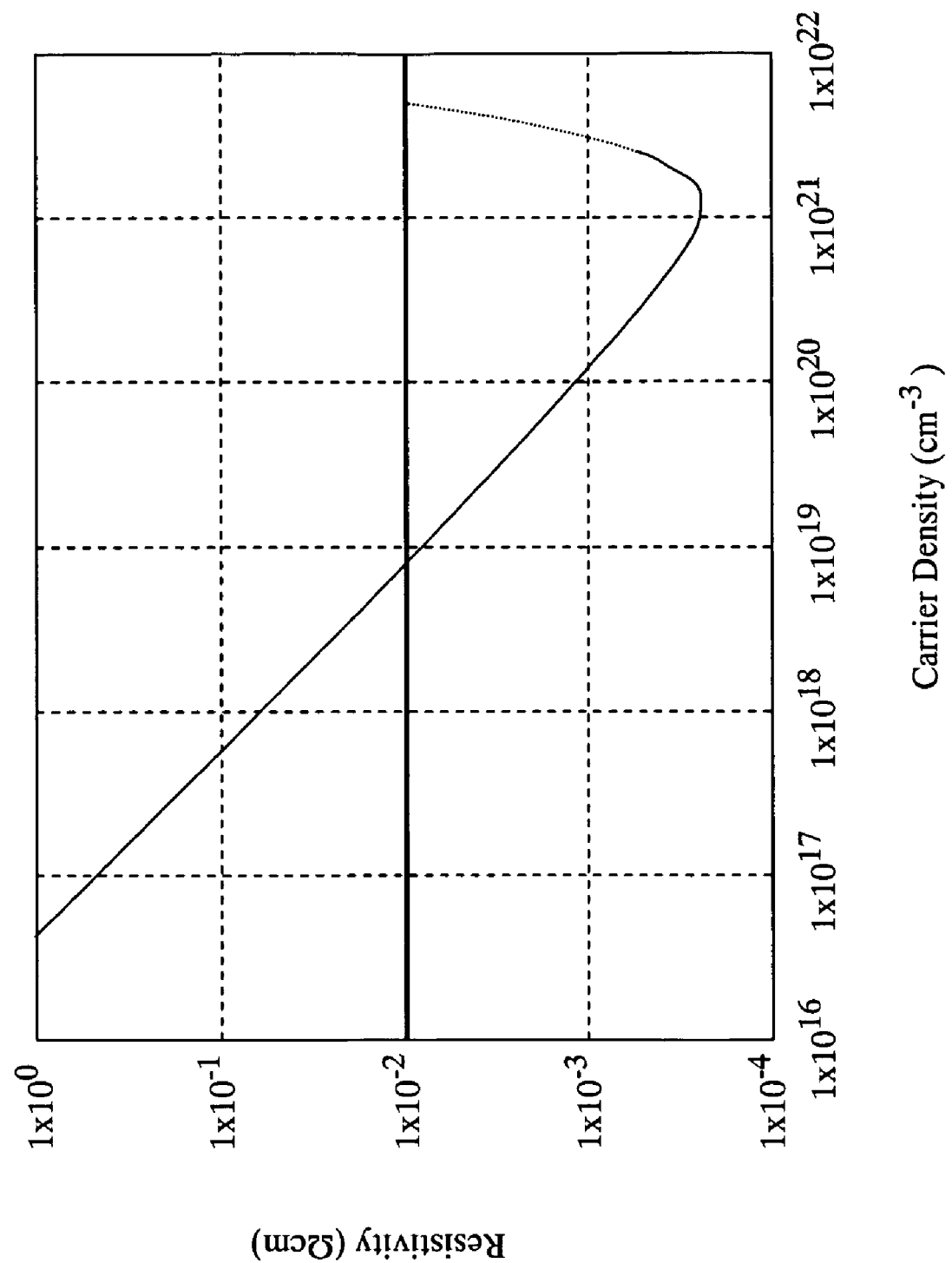
FIG. 3 is a view explaining an experimental result about resistivity versus Ga carrier concentration to $Mg_zZn_{1-z}O$.

Now, the inventor has discovered that resistance decreases greatly by doping $Mg_2Zn_{1-z}O$ with Ga or B, which is an IIIB group element. In FIG. 3, a relationship of Ga carrier concentration to $Mg_2Zn_{1-z}O$ versus resistivity is shown. In FIG. 3, a horizontal axis shows the carrier concentration and a vertical axis shows the resistivity. According to FIG. 3, it shows that the resistivity decreases as the carrier concentration is increased, and that the resistivity increases rapidly once the carrier concentration exceeds $1 \times 10^{21}$. It is preferable that the resistivity is $1 \times 10^{-2}$ $\Omega \cdot cm$ or less when employing an electrode film comprising Ga doped $Mg_zZn_{1-z}O$ ($0 \leq z < 1$) as an electrode for electric current diffusion. It is suitable that the carrier concentration is $1 \times 10^{19}$ $cm^{-3}$ or more and $5 \times 10^{21}$ $cm^{-3}$ or less according to FIG. 3, under this condition. These features mentioned above are applicable to the case B is doped instead of Ga. Because the resistivity of MgZnO electrode film formed under such a condition is smaller than that of a p type GaN system semiconductor layer, in the GaN system semiconductor light emitting device shown in FIG. 1, electric current injected from the metal electrode 11 can easily diffuse in the lateral direction in the MgZnO electrode film 12. The electric current diffused in the lateral direction is supplied extensively to the light emission layer 14 through the p type GaN system semiconductor layer 13. Because the electric current spreading is sufficient, holes are extensively supplied to the light emission layer 14, thereby it enables to achieve an efficient light emission.

On the other hand, electrons injected from the metal electrode 16 pass through the n type GaN system semiconductor layer 15, and recombines with holes in the light emission layer 14. The light propagating in the direction of the p type GaN system semiconductor layer 13 from among the light emitted by the recombination, passes through the MgZnO electrode film 12 and is emitted outside. Here, by means of a doped Mg, the ZnO film can retain its high transmittance even for the short wavelength of about 400 nm. Because the light emitted in the light emission layer 14 passes through the MgZnO electrode film 12, the light can be efficiently emitted or extracted outside.

Therefore, in the GaN system semiconductor light emitting device described according to the embodiment of the implementation, a semiconductor light emitting device is excellent in light emission efficiency and light extracting efficiency can be provided by means of Ga or B doped $Mg_zZn_{1-z}O$ ($0 \leq z < 1$) as a transparent-electrode film.

Figure 4:
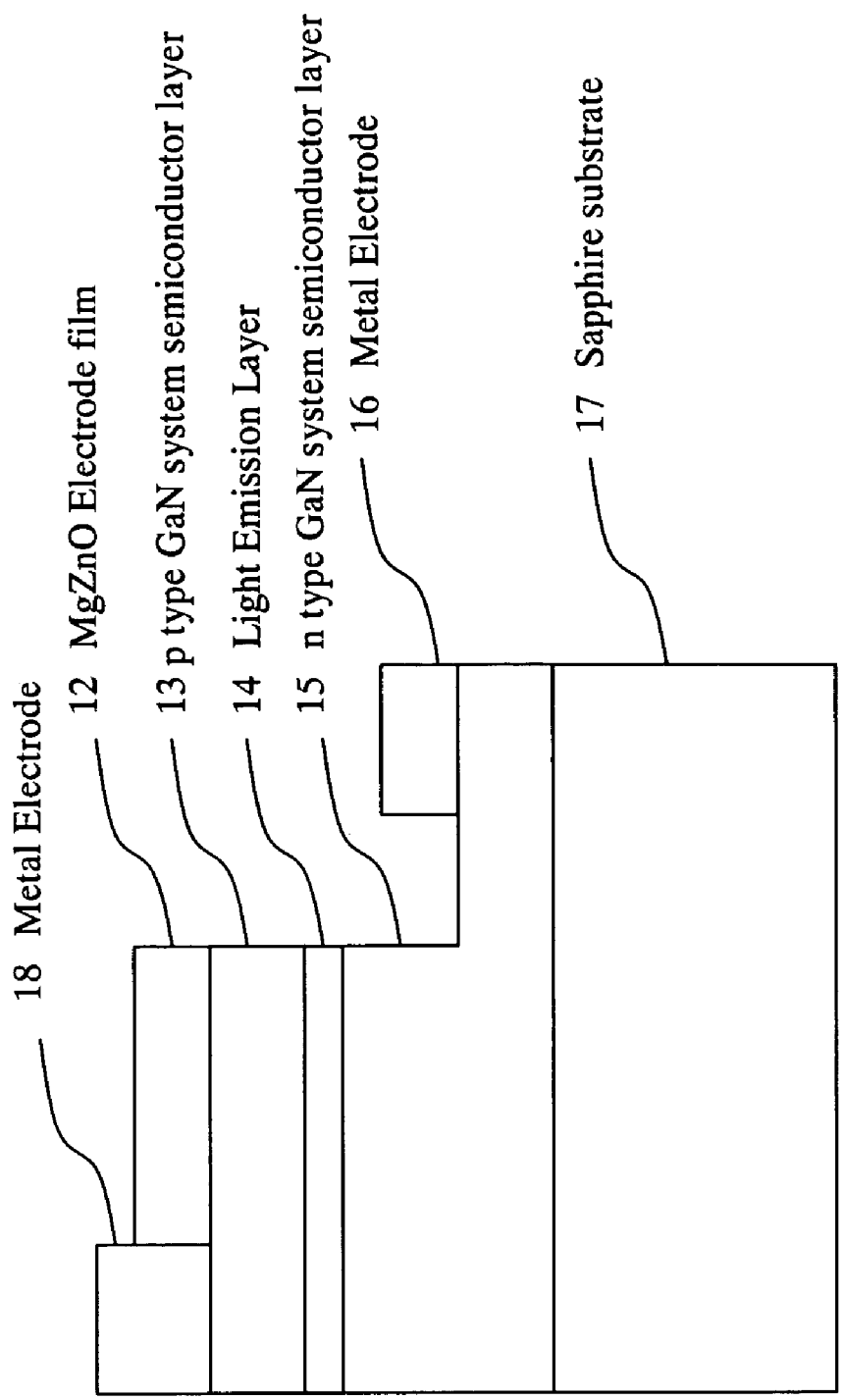
FIG. 4 is a view explaining a structure of a GaN system semiconductor light emitting device according to another embodiment of the present application.

A second embodiment of the present invention is shown in FIG. 4. In FIG. 4, 12 is a MgZnO electrode film, 13 is a p type GaN system semiconductor layer, 14 is a light emission layer, 15 is an n type GaN system semiconductor layer, 16 is a metal electrode, and 17 is a sapphire substrate, and 18 is a metal electrode.

There exists a point of difference between the second and first embodiments in that the metal electrode 18 is not formed on the top surface of the MgZnO electrode film 12, but formed on the top surface of the p type GaN system semiconductor layer 13, such that it is adjacent to the MgZnO electrode film 12. When the MgZnO electrode film 12 is thick, a contact area between the metal electrode 18 and the MgZnO electrode film 12 increases, and thus holes supplied from the metal electrode 18 are diffused, in the lateral direction, to the MgZnO electrode film 12.

The GaN system semiconductor light emitting device shown in FIG. 4 is manufactured by the same process as the GaN system semiconductor light emitting device shown in FIG. 1 up to the formation of the p type GaN system semiconductor layer 13 on the top surface of the light emission layer 14. The p type GaN system semiconductor layer 13 is formed on the top surface of the light emission layer 14, and then after there has been formed the MgZnO transparent electrode film 12, comprising Ga doped $Mg_zZn_{1-z}O$ ($0 \leq z < 1$), on the top surface of the p type GaN system semiconductor 13, there is removed a portion of the MgZnO transparent electrode film 12, the p type GaN system semiconductor layer 13, the light emission layer 14, and the n type GaN system semiconductor layer 15, by etching, respectively. The n type GaN system semiconductor layer 15 is etched down to the midway of the layer thereof. The part of MgZnO electrode film 12, where the metal electrode 18 is formed, is removed by etching. The metal electrode 16 is formed on the top surface of the exposed n type GaN system semiconductor layer 15, and the metal electrode 18 is formed on the top surface of the exposed p type GaN system semiconductor layer 13, with an evaporation method or a sputtering method. A Ga-doped $Mg_zZn_{1-z}O$ ($0 \leq z < 1$) may be replaced by a B-doped $Mg_zZn_{1-z}O$ ($0 \leq z < 1$).

Alternatively, after there has been formed the p type GaN system semiconductor layer 13 on the top surface of the light emission layer 14, there is removed a portion of the p type GaN system semiconductor layer 13, the light emission layer 14, and the n type GaN system semiconductor layer 15 by etching, respectively. The n type GaN system semiconductor layer 15 is etched down to the midway of the layer thereof, and the metal electrode 16 is formed on the top surface of the exposed n type GaN system semiconductor layer 15, with an evaporation method or a sputtering method. The metal electrode 18 is formed on the top surface of the p type GaN system semiconductor layer 13, with the evaporation method or the sputtering method. The MgZnO electrode film 12, which comprises Ga-doped $Mg_zZn_{z-1}O$ ($0 \leq z < 1$), is formed with a sputter method, an ion plating method, and an evaporation method. Alternatively, the n type GaN system semiconductor layer 15 is etched down to the midway of the layer thereof, and then after having formed the ZnO transparent electrode film 12, which comprises Ga doped $Mg_zZn_{1-z}O$ ($0 \leq z < 1$), with a sputter method, an ion plating method, and an evaporation method, the metal electrode 16 is formed on the top surface of the exposed n type GaN system semiconductor layer 15, and the metal electrode 18 is formed on the top surface of the p type GaN system semiconductor layer 13 with an evaporation method or a sputtering method, respectively. A Ga-doped $Mg_zZn_{1-z}O$ ($0 \leq z < 1$) may be replaced by B-doped $Mg_zZn_{1-z}O$ ($0a \leq z < 1$).

In FIG. 4, because the resistivity of MgZnO electrode film 12 is smaller than the resistivity of the p type GaN system semiconductor layer 13, in the GaN system semiconductor light emitting device shown in FIG. 4, electric current injected from the metal electrode 18 can easily diffuse in the lateral direction, in the MgZnO electrode film 12. The electric current diffused in the lateral direction is supplied extensively to the light emission layer 14 through the p type GaN system semiconductor layer 13. Because the electric current spreading is sufficient, holes are extensively supplied to the light emission layer 14, thereby enabling the achievement of an efficient light emission. Because the light emitted in the light emission layer 14 passes through the MgZnO electrode film 12, the light emitted can be efficiently taken out or extracted outside.

Therefore, in the GaN system semiconductor light emitting device described according to the second embodiment, a semiconductor light emitting device is excellent in light emission efficiency and light extracting efficiency can be achieved by using Ga or B doped $Mg_zZn_{1-z}O$ ($0 \leq z < 1$) as a transparent-electrode film.

Figure 5:
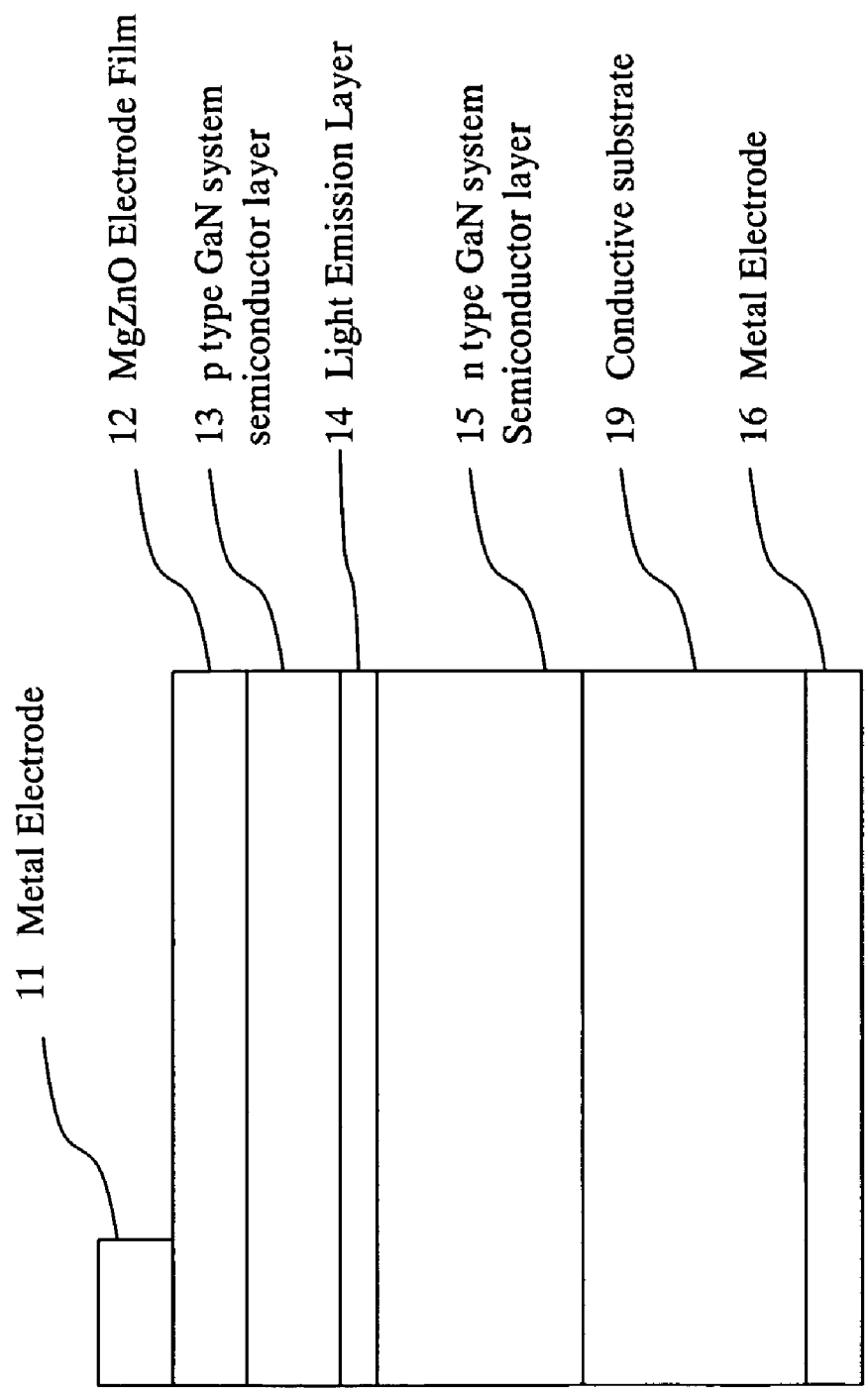
FIG. 5 is a view explaining a structure of a GaN system semiconductor light emitting device according to other embodiment of the present application.
Figure 6:
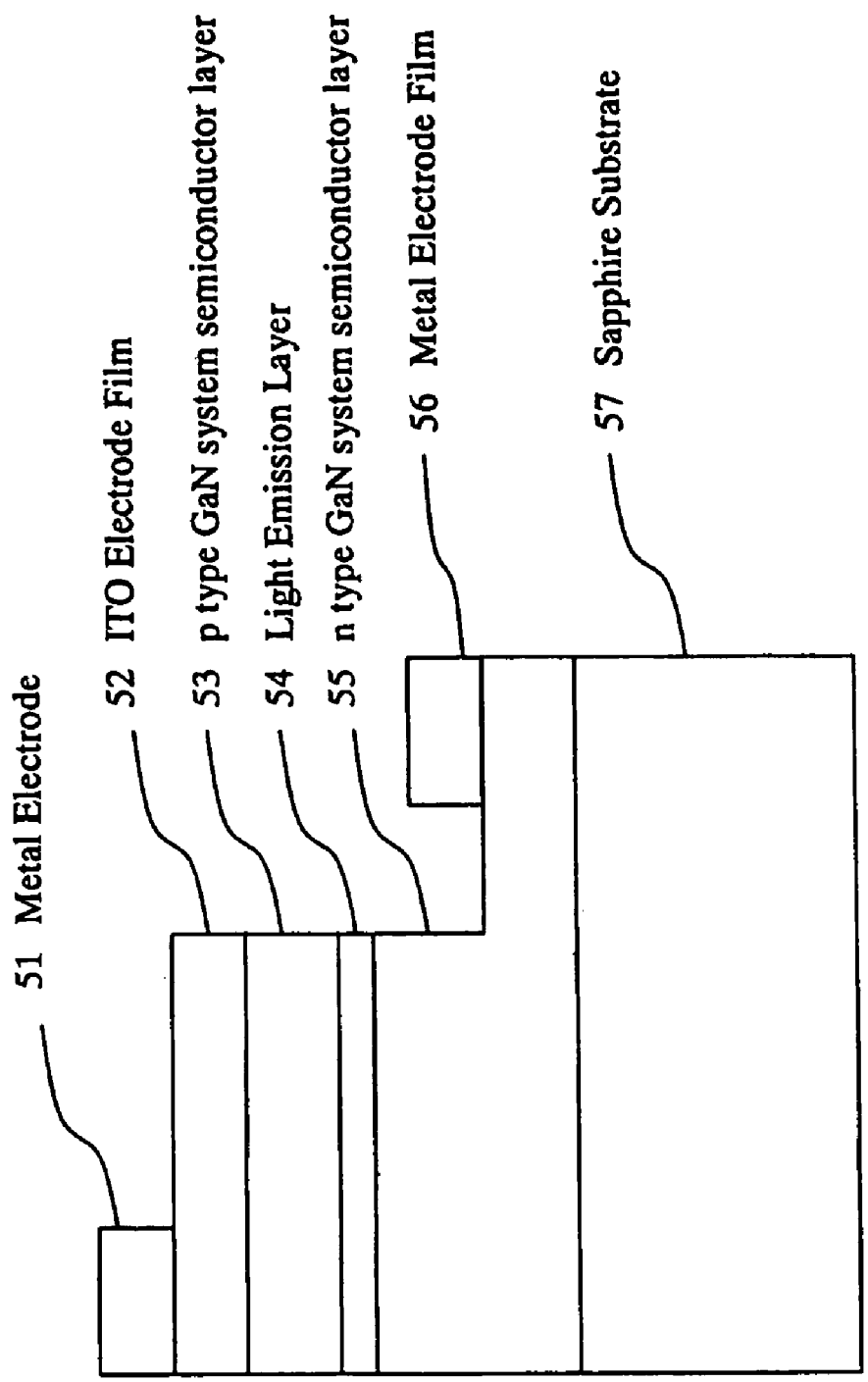
FIG. 6 is a view explaining a structure of a conventional GaN system semiconductor light emitting device.

A third embodiment of the present invention is shown in FIG. 5. In FIG. 5, 11 is a metal electrode, 12 is a MgZnO electrode film, 13 is a p type GaN system semiconductor layer, 14 is a light emission layer, 15 is an n type GaN system semiconductor layer, 16 is a metal electrode, and 19 is a conductive substrate.

There exists a point of difference between third embodiment and the first or the second embodiment point in that the n type GaN system semiconductor layer 15, the light emission layer 14, the p type GaN system semiconductor layer 13, and etc. are laminated on a conductive substrate 19. For the conductive substrate 19, SiC and ZnO can be applied. Ni and NiSi alloy can be applied as the metal electrode 16, when applying SiC to the conductive substrate 19. A Ti/Au laminating electrode can be applied as the metal electrode 16, when applying ZnO to the conductive substrate 19.

In the GaN system semiconductor light emitting device shown in FIG. 5, the n type GaN system semiconductor layer 15, the light emission layer 14, the p type GaN system semiconductor layer 13, and etc. are laminated on the conductive substrate 19, by the same process as the GaN system semiconductor light emitting device shown in FIG. 1. However, laminating the n type GaN system semiconductor layer 15, and etc. on the conductive substrate 19 makes unnecessary a process for etching starting from the upper portion of the GaN system semiconductor light emitting device and forming a metal electrode connecting to the n type GaN system semiconductor layer 15, like the first or the second embodiment. For this reason, simplification of the manufacturing process and improvement in reliability can be attained.

Also in the GaN system semiconductor light emitting device shown in FIG. 5, because the resistivity of the MgZnO electrode film 12 is smaller than the resistivity of the p type GaN system semiconductor layer 13, electric current injected from the metal electrode 11 can easily diffuse in the lateral direction, in the MgZnO electrode film 12. The electric current diffused in the lateral direction is supplied extensively to the light emission layer 14 through the p type GaN system semiconductor layer 13. Because the electric current spreading is sufficient, holes are extensively supplied to the light emission layer 14, thereby it enables to achieve an efficient light emission. Because the light emitted in the light emission layer 14 passes through the MgZnO electrode film 12, the emitted light can be efficiently extracted out.

Therefore, in the GaN system semiconductor light emitting device described in connection with the third embodiment, there could be achieved a semiconductor light emitting device excellent in light emission efficiency and light extracting efficiency or light exit efficiency by using Ga or B doped $Mg_zZn_{1-z}O$ ($0 \leq z < 1$) as a transparent-electrode film.

Although in case of the embodiments 1 and 2 of the GaN system semiconductor layers are formed on the top surface of the sapphire substrate 17 and the sapphire substrate 17 is utilized as a mounting substrate, there can be also realized a variation of a structure, in which the sapphire substrate 17 is removed from the GaN system semiconductor layer of such a structure, wherein there can be taken out the light emitted in the light emission layer, from the n type GaN system semiconductor layer. Moreover, it is also possible to construct a semiconductor light emitting device with such a structure that there is laminated from the beginning consecutively on a substrate, at least a p type GaN system semiconductor layer, a light emission layer, and an n type GaN system semiconductor layer.

In a semiconductor light emitting device with such a structure, a metal electrode is formed on the top surface of an n type GaN system semiconductor layer. A GaN system semiconductor light emitting device of a structure, which has a metal electrode formed on the top surface of an n type GaN system semiconductor layer, has a Ga doped MgZnO electrode film formed on the top surface of the n type GaN system semiconductor layer. The metal electrode may be formed on the top surface of the Ga doped MgZnO electrode film like the first embodiment, or may be formed such that it is not only contiguous to the n type GaN system semiconductor layer, but also adjoins to the Ga doped MgZnO electrode layer like the second embodiment. In addition, a GaN system semiconductor may be formed on the top surface of a conducting substrate like the third embodiment. A Ga-doped MgZnO electrode film may be replaced by B-doped MgZnO electrode film.

Even in a GaN system semiconductor light emitting device which has a Ga or B doped MgZnO electrode film on the top surface of the n type GaN system semiconductor layer, a semiconductor light emitting device is excellent in light emission efficiency and light extracting efficiency can be realized by using Ga or B doped $Mg_zZn_{1-z}O$ ($0 \leq z < 1$) as a transparent-electrode film.

Effect of the Invention

As described above, the GaN system semiconductor light emitting devices as described in connection with the embodiments of the present invention, is featured by using Ga or B doped $Mg_zZn_{1-z}O$ ($0 \leq z < 1$) as a transparent-electrode film, thereby it enables to lower resistivity and furthermore to increase the transmittance of the emitted light, with the result that a semiconductor light emitting devices is excellent in light emission efficiency and light extracting efficiency or light exit efficiency, can be realized.

What is claimed is:

1. A semiconductor light emitting device comprising a light emission layer, consisting of a GaN system semiconductor, which is interposed between an n type GaN system semiconductor layer and a p type GaN system semiconductor layer, wherein there is provided a Ga-doped $Mg_zZn_{1-z}O$ ($0 \leq z < 1$) electrode film.

2. The semiconductor light emitting device according to claim 1, characterized in that associated with a quantity of doped Ga, with which the $Mg_zZn_{1-z}O$ ($0 \leq z < 1$) electrode film is doped, wherein a carrier concentration is $1 \times 10^{19}$ cm$^{-3}$ or more and $5 \times 10^{21}$ cm$^{-3}$ or less.

3. The semiconductor light emitting device according to claim 1, characterized in that there is provided a metal electrode, which supplies an electric current to either the n type GaN system semiconductor layer or the p type GaN system semiconductor layer, and that said Ga-doped $Mg_zZn_{1-z}O$ ($0 \leq z < 1$) electrode film is formed between the n type GaN system semiconductor layer or the p type GaN system semiconductor layer, and the metal electrode.

4. The semiconductor light emitting device according to claim 3, characterized in that associated with a quantity of, the doped Ga, with which the $Mg_zZn_{1-z}O$ ($0 \leq z < 1$) electrode film is doped, wherein a carrier concentration is $1 \times 10^{19}$ cm$^{-3}$ or more and less than $5 \times 10^{21}$ cm$^{-3}$.

5. The semiconductor light emitting device according to claim 1, characterized in that there is provided a metal electrode, which supplies an electric current to either the n type GaN system semiconductor layer or the p type GaN system semiconductor layer, and that the metal electrode and the Ga-doped $Mg_zZn_{1-z}O$ ($0 \leq z < 1$) electrode film adjoin each other; and the metal electrode and the Ga-doped $Mg_zZn_{1-z}O$ ($0 \leq z < 1$) electrode film are arranged so as to be contiguous to the face of the n type GaN system semiconductor layer or the p type GaN system semiconductor layer.

6. The semiconductor light emitting device according to claim 5, characterized in that associated with a quantity of the doped Ga, with which the $Mg_zZn_{1-z}O$ ($0 \leq z < 1$) electrode is doped, wherein a carrier concentration is $1 \times 10^{19}$ cm$^{-3}$ or more and less than $5 \times 10^{21}$ cm$^{-3}$.

7. A semiconductor light emitting device comprising a light emission layer, consisting of a GaN system semiconductor, which is interposed between a n type GaN system semiconductor layer and a p type GaN system semiconductor layer, wherein there is provided a B-doped $Mg_zZn_{1-z}O$ ($0 \leq z < 1$) electrode film disposed on one of the GaN system semiconductor layers.

8. The semiconductor light emitting device according to claim 7, characterized in that there is provided a metal electrode, which supplies an electric current to either the n type GaN system semiconductor layer or the p type GaN system semiconductor layer, wherein said B-doped $Mg_zZn_{1-z}O$ ($0 \leq z < 1$) electrode film is formed between the n type GaN system semiconductor layer or the p type GaN system semiconductor layer, and the metal electrode.

9. The semiconductor light emitting device according to claim 7, characterized in that there is provided a metal electrode, which supplies an electric current to either the n type GaN system semiconductor layer or the p type GaN system semiconductor layer, wherein the metal electrode and the B-doped $Mg_zZn_{1-z}O$ ($0 \leq z < 1$) electrode film adjoin each other and the metal electrode and the B-doped $Mg_zZn_{1-z}O$ ($0 \leq z < 1$) electrode film are arranged so as to be contiguous to the face of the n type GaN system semiconductor layer or the p type GaN system semiconductor layer.

10. A semiconductor light emitting device comprising a light emission layer, consisting of a GaN system semiconductor, which is interposed between a n type GaN system semiconductor layer and a p type GaN system semiconductor layer, wherein there is provided a B-doped $Mg_zZn_{1-z}O$ ($0 \leq z < 1$) electrode film disposed on one of the GaN system semiconductor layers:
characterized in that associated with a quantity of the doped B, with which the $Mg_zZn_{1-z}O$ ($0 \leq z < 1$) electrode is doped, wherein a carrier concentration is $1 \times 10^{19}$ cm$^{-3}$ or more and less than $5 \times 10^{21}$ cm$^{-3}$.

11. A semiconductor light emitting device comprising a light emission layer, consisting of a GaN system semiconductor, which is interposed between a n type GaN system semiconductor layer and a p type GaN system semiconductor layer, wherein there is provided a B-doped $Mg_zZn_{1-z}O$ ($0 \leq z < 1$) electrode film disposed on one of the GaN system semiconductor layers;
characterized in that there is provided a metal electrode, which supplies an electric current to either the n type GaN system semiconductor layer or the p type GaN system semiconductor layer, wherein said B-doped $Mg_zZn_{1-z}O$ ($0 \leq z < 1$) electrode film is formed between the n type GaN system semiconductor layer or the p type GaN system semiconductor layer, and the metal electrode;
characterized in that associated with a quantity of the doped B, with which the $Mg_zZn_{1-z}O$ ($0 \leq z < 1$) electrode is doped, wherein a carrier concentration is $1 \times 10^{19}$ cm$^{-3}$ or more and less than $5 \times 10^{21}$ cm$^{-3}$.

12. A semiconductor light emitting device comprising a light emission layer, consisting of a GaN system semiconductor, which is interposed between a n type GaN system semiconductor layer and a p type GaN system semiconductor layer, wherein there is provided a B-doped $Mg_zZn_{1-z}O$ ($0 \leq z < 1$) electrode film disposed on one of the GaN system semiconductor layers;

characterized in that there is provided a metal electrode, which supplies an electric current to either the n type GaN system semiconductor layer or the p type GaN system semiconductor layer, wherein the metal electrode and the B-doped $Mg_zZn_{1-z}O$ ($0 \leq z < 1$) electrode film adjoin each other and the metal electrode and the B-doped $Mg_zZn_{1-z}O$ ($0 \leq z < 1$) electrode film are arranged so as to be contiguous to the face of the n time GaN system semiconductor layer or the p type GaN system semiconductor layer;

characterized in that associated with a quantity of the doped B, with which the $Mg_zZn_{1-z}O$ ($0 \leq z < 1$) electrode is doped, wherein a carrier concentration is $1 \times 10^{19}$ cm$^{-3}$ or more and less than $5 \times 10^{21}$ cm$^{-3}$.

* * * * *

UNITED STATES PATENT AND TRADEMARK OFFICE
CERTIFICATE OF CORRECTION

PATENT NO.         : 7,196,348 B2                                                  Page 1 of 1
APPLICATION NO. : 10/763137
DATED              : March 27, 2007
INVENTOR(S)        : Ken Nakahara It is certified that error appears in the above-identified patent and that said Letters Patent is hereby corrected as shown below:

Column 12, line 3, "arranged so as to be contiguous to the face of the n time"

"n time" should be corrected to --n type--

Signed and Sealed this

Third Day of July, 2007

JON W. DUDAS
*Director of the United States Patent and Trademark Office*